United States Patent
Kavisekara et al.

(10) Patent No.: US 12,201,167 B2
(45) Date of Patent: Jan. 21, 2025

(54) CONDUCTIVE GARMENT FASTENING PRODUCT

(71) Applicant: Prym Intimates Group Limited, Kowloon (HK)

(72) Inventors: Heenatikumbure Kavisekara Mudiyanselage Anjana Piushan Kavisekara, Pilawala Kandy (LK); Jayasuriya Arachchige Palitha Dhanushka Jayasuriya, Gonahena Kadawatha (LK); Hapuarachchige Don Rasun Sajeewa, Wanaluwava (LK); Hettige Don Dinesh Kumara, Kaduwela (LK)

(73) Assignee: Prym Intimates Group Limited, Kowloon (HK)

( * ) Notice: Subject to any disclaimer, the term of this patent is extended or adjusted under 35 U.S.C. 154(b) by 644 days.

(21) Appl. No.: 17/603,319

(22) PCT Filed: Apr. 6, 2020

(86) PCT No.: PCT/SG2020/050211
§ 371 (c)(1),
(2) Date: Oct. 12, 2021

(87) PCT Pub. No.: WO2020/209794
PCT Pub. Date: Oct. 15, 2020

(65) Prior Publication Data
US 2022/0183402 A1    Jun. 16, 2022

(30) Foreign Application Priority Data
Apr. 12, 2019    (GB) .................................... 1905188

(51) Int. Cl.
| | |
|---|---|
| *A41D 1/00* | (2018.01) |
| *A41F 1/00* | (2006.01) |
| *A44B 13/00* | (2006.01) |
| *A44B 17/00* | (2006.01) |
| *H01R 4/28* | (2006.01) |
| *H05K 1/03* | (2006.01) |
| *H05K 3/10* | (2006.01) |

(52) U.S. Cl.
CPC .............. *A41D 1/005* (2013.01); *A41F 1/006* (2013.01); *A44B 13/0052* (2013.01);
(Continued)

(58) Field of Classification Search
CPC . A41D 1/005; A41F 1/006; A41F 1/00; A44B 13/0052; A44B 17/0058;
(Continued)

(56) References Cited

U.S. PATENT DOCUMENTS

| | | | |
|---|---|---|---|
| 6,350,129 B1 | 2/2002 | Gorlick | |
| 11,936,070 B2 * | 3/2024 | Nunez Lopez | ........ H05K 3/305 |

(Continued)

FOREIGN PATENT DOCUMENTS

| | | |
|---|---|---|
| EP | 2622981 A1 | 8/2013 |
| FR | 2853499 A1 | 10/2004 |

(Continued)

OTHER PUBLICATIONS

International Search Report issued in International Application No. PCT/SG2020/050211 dated Jun. 22, 2020 (4 pages).
(Continued)

*Primary Examiner* — Travis S Chambers
(74) *Attorney, Agent, or Firm* — Osha Bergman Watanabe & Burton LLP

(57) ABSTRACT

An aspect of the present disclosure describes a conductive garment fastening product for a garment, comprising a first article coupleable to a second article for fastening the garment. The first article comprises: a first substrate; an array of first conductive fasteners attached to the first substrate, the array comprising a plurality of rows and a plurality of columns; and a set of first conductive paths disposed conductively along the rows of first conductive fasteners. The first conductive fasteners are engageable with second conductive fasteners of the second article for cou-
(Continued)

pling the first and second articles together and forming a conductive connection therethrough.

18 Claims, 13 Drawing Sheets

(52) U.S. Cl.
CPC .......... *A44B 17/0058* (2013.01); *H01R 4/28* (2013.01); *H05K 1/038* (2013.01); *H05K 3/103* (2013.01); *A41B 2300/324* (2013.01); *A41B 2300/326* (2013.01); *H05K 2201/0281* (2013.01)

(58) Field of Classification Search
CPC .......... H01R 4/28; H05K 1/038; H05K 3/103; H05K 2201/0281; A41B 2300/324; A41B 2300/326
See application file for complete search history.

(56) References Cited

U.S. PATENT DOCUMENTS

| | | | |
|---|---|---|---|
| 2008/0043458 A1* | 2/2008 | Desjardin | G08B 5/004 362/108 |
| 2009/0203244 A1 | 8/2009 | Toonder et al. | |
| 2014/0084045 A1 | 3/2014 | Yang et al. | |
| 2017/0172221 A1 | 6/2017 | Esenwein et al. | |
| 2017/0244208 A1 | 8/2017 | Barth et al. | |
| 2017/0251732 A1 | 9/2017 | Furey | |
| 2018/0049481 A1 | 2/2018 | Tourrette et al. | |
| 2018/0249767 A1* | 9/2018 | Begriche | A41F 15/002 |
| 2018/0260052 A1 | 9/2018 | Karagozler | |
| 2021/0244332 A1* | 8/2021 | Hagihara | D03D 15/67 |

FOREIGN PATENT DOCUMENTS

| | | |
|---|---|---|
| GB | 2436718 A | 10/2007 |
| JP | 3047958 U | 4/1998 |
| JP | 2018007990 A | 1/2018 |
| JP | 2018170192 A | 11/2018 |
| WO | 2004091330 A2 | 10/2004 |

OTHER PUBLICATIONS

Written Opinion issued in International Application No. PCT/SG2020/050211 dated Jun. 22, 2020 (7 pages).
Search Report issued in GB Application No. GB1905188.7, dated Oct. 8, 2019 (3 pages).
Notification of Reasons for Refusal issued in Japanese Application No. 2021-560700, mailed on Nov. 29, 2023 (5 pages).

* cited by examiner

CONDUCTIVE GARMENT FASTENING PRODUCT

TECHNICAL FIELD

The present disclosure generally relates to a conductive garment fastening product. More particularly, the present disclosure describes various embodiments of a garment fastening product with conductive fasteners and conductive paths, as well as a method of manufacturing such garment fastening products.

BACKGROUND

Various types of garments, particularly intimate garments such as brassieres, lingerie, sportswear, and similar close-fitting or form-fitting garments, have components which are used to fasten the garment when wearing and similarly to unfasten the garment when removing. Developments in wearable technology have created garments with built-in electronic functions and capabilities. A user wearing the garment operates an electronic component to activate/deactivate the electronic functions and capabilities of the garment. One apparent problem is that there seems to be a lack of integration between said activation/deactivation with wearing of the garment.

Therefore, in order to address or alleviate at least the aforementioned problem or disadvantage, there is a need to provide an improved garment fastening product as well as a method of manufacturing such garment fastening products.

SUMMARY

According to a first aspect of the present disclosure, there is a garment fastening product for a garment, comprising a first article coupleable to a second article for fastening the garment. The first article comprises: a first substrate; an array of first conductive fasteners attached to the first substrate, the array comprising a plurality of rows and a plurality of columns; and a set of first conductive paths disposed conductively along the rows of first conductive fasteners. The first conductive fasteners are engageable with second conductive fasteners of the second article for coupling the first and second articles together and forming a conductive connection therethrough.

According to a second aspect of the present disclosure, there is a method of manufacturing garment fastening products, each garment fastening product comprising a first article and a second article coupleable to each other for fastening a garment. The method comprises manufacturing a set of the first articles, comprising: producing a first body; forming first conductive paths and first conductive fasteners on the first body, the first conductive fasteners formed as a plurality of rows and a plurality of columns, the first conductive paths disposed conductively along the rows of first conductive fasteners; and apportioning the first body into a set of first substrates, each first substrate comprising a set of the first conductive paths and an array of the first conductive fasteners formed thereon, the array comprising equal columns and at least two rows; and obtaining each first article comprising a first substrate. For each garment fastening product, the first conductive fasteners of the first article are engageable with second conductive fasteners of the second article for coupling the first and second articles together and forming a conductive connection therethrough.

An advantage of one or more of the above aspects of the present disclosure is that the garment fastening product allows fastening of the garment to form a conductive connection through the first and second articles. This conductive connection may in turn activate built-in electronic functions and capabilities of the garment. Accordingly, the garment fastening product functions as a type of switch and the electronic functions are activated and deactivated in response to coupling and decoupling, respectively, of the first and second articles. The person or wearer of the garment can thus easily activate the electronic functions by wearing the garment, and consequently deactivate them by removing the garment. Another advantage is that by providing a plurality of columns of the first conductive fasteners for the first article, any one of the columns can be selectively engaged with the second conductive fasteners of the second article. For the person wearing the garment using the garment fastening product, said selective engagement allows for adjusting the fit of the garment on the person.

A garment fastening product and a method of manufacturing the garment fastening products according to the present disclosure are thus disclosed herein. Various features, aspects, and advantages of the present disclosure will become more apparent from the following detailed description of the embodiments of the present disclosure, by way of non-limiting examples only, along with the accompanying drawings.

DETAILED DESCRIPTION

In the present disclosure, depiction of a given element or consideration or use of a particular element number in a particular figure or a reference thereto in corresponding descriptive material can encompass the same, an equivalent, or an analogous element or element number identified in another figure or descriptive material associated therewith. The use of "/" in a figure or associated text is understood to mean "and/or" unless otherwise indicated. As used herein, the term "set" corresponds to or is defined as a non-empty finite organization of elements that mathematically exhibits a cardinality of at least one (e.g. a set as defined herein can correspond to a unit, singlet, or single element set, or a multiple element set), in accordance with known mathematical definitions. The recitation of a particular numerical value or value range herein is understood to include or be a recitation of an approximate numerical value or value range.

For purposes of brevity and clarity, descriptions of embodiments of the present disclosure are directed to a garment fastening product and a method of manufacturing the garment fastening products, in accordance with the drawings. While aspects of the present disclosure will be described in conjunction with the embodiments provided herein, it will be understood that they are not intended to limit the present disclosure to these embodiments. On the contrary, the present disclosure is intended to cover alternatives, modifications and equivalents to the embodiments described herein, which are included within the scope of the present disclosure as defined by the appended claims. Furthermore, in the following detailed description, specific details are set forth in order to provide a thorough understanding of the present disclosure. However, it will be recognized by an individual having ordinary skill in the art, i.e. a skilled person, that the present disclosure may be practiced without specific details, and/or with multiple details arising from combinations of aspects of particular embodiments. In a number of instances, well-known systems, methods, procedures, and components have not been described in detail so as to not unnecessarily obscure aspects of the embodiments of the present disclosure.

Figure 1A:
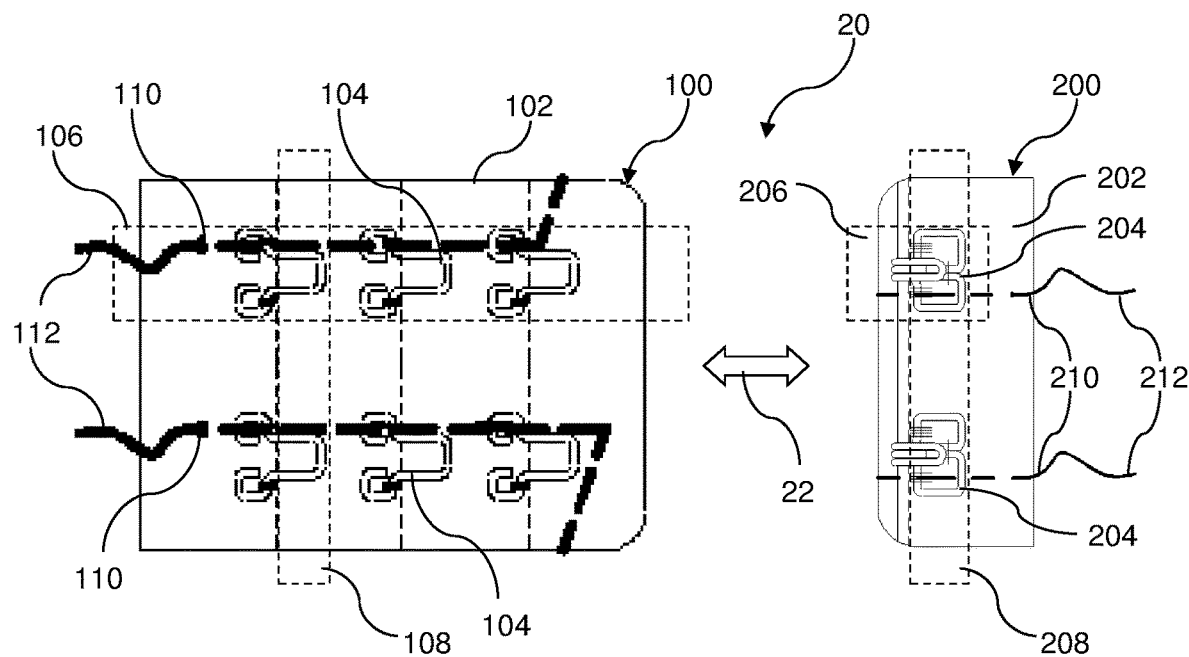
FIG. 1A and FIG. 1B are illustrations of a garment fastening product having a first article and a second article, in accordance with embodiments of the present disclosure.

In representative or exemplary embodiments of the present disclosure, there is a garment fastening product 20 for a garment (not shown) as illustrated in FIG. 1A. The garment may be an intimate garment or undergarment, such as but not limited to brassieres, lingerie, sportswear, and similar close-fitting or form-fitting garments. In some embodiments, the garment fastening product 20 includes a first article 100 coupleable 22 to or engageable with a second article 200 for fastening the garment. In some other embodiments, the garment fastening product 20 includes the first article 100 and the second article 200. The first article 100 may be referred to as the female counterpart, and the second article 200 may be referred to as the male counterpart.

The first article 100 includes a first substrate 102 and an array of first conductive fasteners 104 attached to the first substrate 102. The first substrate 102 forms the body or base of the first article 100 for the first conductive fasteners 104 to be attached thereto. The array of first conductive fasteners 104 includes a plurality of rows 106 and a plurality of columns 108. The rows 106 are defined as horizontal and the columns 108 are defined as vertical from the perspective of a person wearing the garment using the garment fastening product 20. As shown in FIG. 1A, the first conductive fasteners 104 are arranged in the horizontal rows 106 and vertical columns 108. The first article 100 further includes a set of first conductive paths 110 disposed conductively along the rows 106 of the first conductive fasteners 104. Specifically, each row 106 of the first conductive fasteners 104 is connected by a first conductive path 110. The first conductive paths 110 enable electricity/electrical signals to be conducted along the first conductive fasteners 104.

The second article 200 includes a second substrate 202 and an array of second conductive fasteners 204 attached to the second substrate 202. The second substrate 202 forms the body or base of the second article 200 for the second conductive fasteners 204 to be attached thereto. The array of second conductive fasteners 202 includes a plurality of rows 206 and one or more columns 208. The rows 206 are defined as horizontal and the columns 208 are defined as vertical from the perspective of a person wearing the garment using the garment fastening product 20. As shown in FIG. 1A, the second conductive fasteners 204 are arranged in the horizontal rows 206 and vertical column 208. The second article 200 further includes a set of second conductive paths 210 disposed conductively along the rows 206 of the second conductive fasteners 204. Specifically, each row 206 of the second conductive fasteners 204 is connected by a second conductive path 210. The second conductive paths 210 enable electricity/electrical signals to be conducted along the second conductive fasteners 204.

The garment fastening product 20 is used in the garment for fastening and unfastening, i.e. closing and opening, the garment by coupling and decoupling 22, respectively, the first article 100 and second article 200. Specifically, the first conductive fasteners 104 of the first article 100 are engageable with the second conductive fasteners 204 of the second article 200 for coupling 22 the first article 100 and second article 200 together. More specifically, at least one column 108 of the first conductive fasteners 104 is engageable with at least one column 208 of the second conductive fasteners 204. Additionally, said coupling 22 forms a conductive connection through the first article 100 and second article 200, specifically via the first conductive fasteners 104 and second conductive fasteners 204 which are engaged together.

Each of the first substrate 102 and second substrate 202 may include a fabric body formed from one or more layers of fabric material. The fabric material may be selected and/or the layers of fabric material may be arranged based on the end applications of the garment fastening product 20 and the garment, as well as various parameters such as thickness and structural strength/integrity of the fabric material. Alternatively, the first substrate 102 and second substrate 202 may include films and/or membranes instead of the fabric bodies.

The first conductive fasteners 104 and second conductive fasteners 204 are made of a conductive material for conducting electrical signals. Some non-limiting examples of a conductive material include stainless steel, brass, silver alloy, and other metallic material/alloy. The conductive material may be selected based on various parameters such as electrical conductivity and/or structural strength for securely engaging the first conductive fasteners 104 with the second conductive fasteners 204.

The first conductive paths 110 and second conductive paths 210 are formed from a conductive material for conducting electrical signals. In one embodiment, the conductive paths 110 and 210 include conductive yarns or threads. The yarns or threads may be coated with a silver material, such as nanosilver, a copper material, or the like. In another embodiment, the conductive paths 110 and 210 include ductile wires/filaments made of conductive metals such as gold and copper. In yet another embodiment, the conductive paths 110 and 210 included or are printed with conductive ink. It will be appreciated various types of conductive inks will be known to the skilled person.

The first conductive fasteners 104 and second conductive fasteners 204 include mutually engageable male and female fasteners that may be formed from known fastening/coupling mechanisms, such as hooks and eyes, hook and loop tapes, snap-fit fasteners, eyelets, snap buttons, and the like. The first conductive fasteners 104 may be referred to as the female fasteners, and the second conductive fasteners 204 may be referred to as the male fasteners as known in the fastening/coupling/fitting mechanisms. The first conductive fasteners 104 and second conductive fasteners 204 are thus mutually engageable for coupling 22 the first article 100 and second article 200 together.

In some embodiments, the rows 106 and 206 are equal, meaning that the first conductive fasteners 104 and second conductive fasteners 204 are arranged in the same number of rows 106 and 206, respectively. As described above, at least one column 108 of the first conductive fasteners 104 is engageable with at least one column 208 of the second conductive fasteners 204. In one embodiment as shown in FIG. 1A, the array of first conductive fasteners 104 has two rows 106 and three columns 108, and the array of second conductive fasteners 204 has two rows 206 and one column 208. The one column 208 can be selectively engaged with any one of the columns 108. For a person wearing the garment using the garment fastening product 20, said selective engagement allows for adjusting the fit of the garment on the person. In another embodiment, the array of first conductive fasteners 104 has two rows 106 and three columns 108, and the array of second conductive fasteners 204 has two rows 206 and two columns 208. The two columns 208 can be selectively engaged with the outer pair of columns 108 or the inner pair of columns 108, thereby allowing for fit adjustment of the garment on the person. Moreover, engaging two pairs of columns 108 and 208 of first conductive fasteners 104 and second conductive fasteners 204 provides for more secure fastening of the garment fastening product 20 and thus more secure fitting of the garment on the person.

A conductive connection is formed in the garment fastening product 20 through the first article 100 and second article 200 upon said coupling 22 thereof by mutual engagement of the first conductive fasteners 104 and second conductive fasteners 204. In the first article 100, ends 112 of the first conductive paths 110 extend beyond the first substrate 102 and are connected or connectable to electronic components of the garment. Similarly, in the second article 200, ends 212 of the second conductive paths 210 extend beyond the second substrate 202 and are connected or connectable to the electronic components. For example, the garment is integrated with wearable technology and has built-in electronic components, including a power source, for performing various electronic functions and operations.

As an example, the garment fastening product 20 is integrated or used in a garment such as a sports brasserie. Opposing side portions, or left and right side portions, of the garment are respectively attached to the first article 100 and second article 200 of the garment fastening product 20. The first and second articles 100 and 200 are coupleable 22 to fasten and unfasten the garment. The garment fastening product 20 may be located around the sagittal plane of the person wearing the garment, and may be located at the front or back of the garment. Each of the opposing side portions is integrated with electronic components for performing various electronic functions and operations. The electronic functions and operations are activated in response to electrical signals conducted between the opposing side portions. A conductive connection is formed upon coupling 22 of the first and second articles 100 and 200, thereby enabling electrical signals to be conducted between the opposing side portions. Accordingly, the garment fastening product 20 functions as a type of switch and the electronic functions and operations are activated and deactivated in response to coupling and decoupling 22, respectively, of the first and second articles 100 and 200. Said activation may refer to maintaining the electronic functions and operations of the garment in an active state, wherein the electronic functions and operations are performed in response to a subsequent action by the person or wearer after the garment is worn. The person or wearer of the garment can thus easily activate the electronic functions and operations by wearing the garment integrated with the garment fastening product 20, and consequently deactivate them by removing the garment.

In embodiments as shown in FIG. 1A, the first conductive fasteners 104 and second conductive fasteners 204, which constitute mutually engageable hooks and eyes, are respectively attached to the first substrate 102 and second substrate 202 first, such as by riveting or stitching using conductive yarns or threads. The first conductive paths 110 and second conductive paths 210 are disposed conductively along the rows 106 of first conductive fasteners 104 and rows 206 of second conductive fasteners 204, respectively. For example, the conductive paths 110 and 210 include conductive yarns or threads that are stitched along the conductive fasteners 104 and 204, such that the conductive yarns or threads are in conductive contact with the fasteners 104 and 204.

Figure 2A:
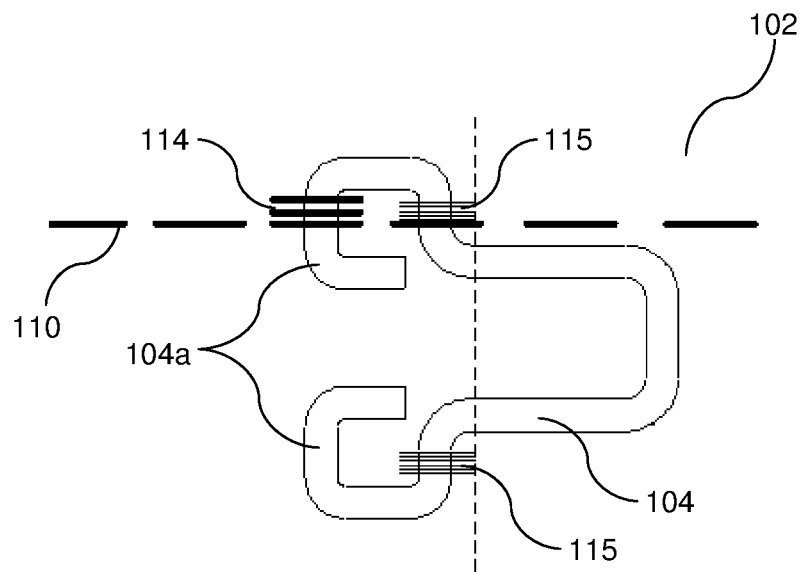
FIG. 2A and FIG. 2B are illustrations of conductive fasteners of the first and second articles, in accordance with embodiments of the present disclosure.
Figure 2B:
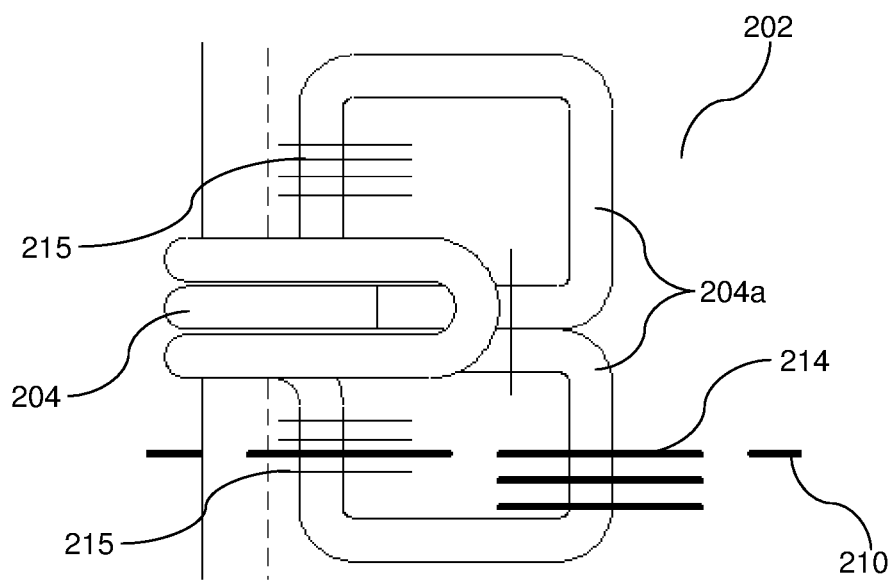

Further with reference to FIG. 2A and FIG. 2B, the conductive fasteners 104 and 204 are connected by respectively conductive paths 110 and 210 which are conductive yarns. The conductive yarns are stitched carefully on the first substrate 102 and second substrate 202 and along the rows 106 and 206 of the conductive fasteners 104 and 204, respectively. Specifically, the stitching pattern ensures that the conductive fasteners 104 and 204 are in conductive contact with the conductive yarns for conducting electrical signals through the conductive fasteners 104 and 204. Additionally, at the portions of the conductive fasteners 104 and 204 (stems 104a and 204a) that are attached to the substrates 102 and 202, the conductive yarns form repetitive stitches 114 and 214 for improved said contact. This reduces the risk of the conductive yarns being unraveled which may loosen or even detach the conductive fasteners 104 and 204. Additionally, normal threads/yarns form repetitive stitches 115 and 215 for securing the conductive fasteners 104 and 204 on the substrates 102 and 202, respectively.

Figure 1B:
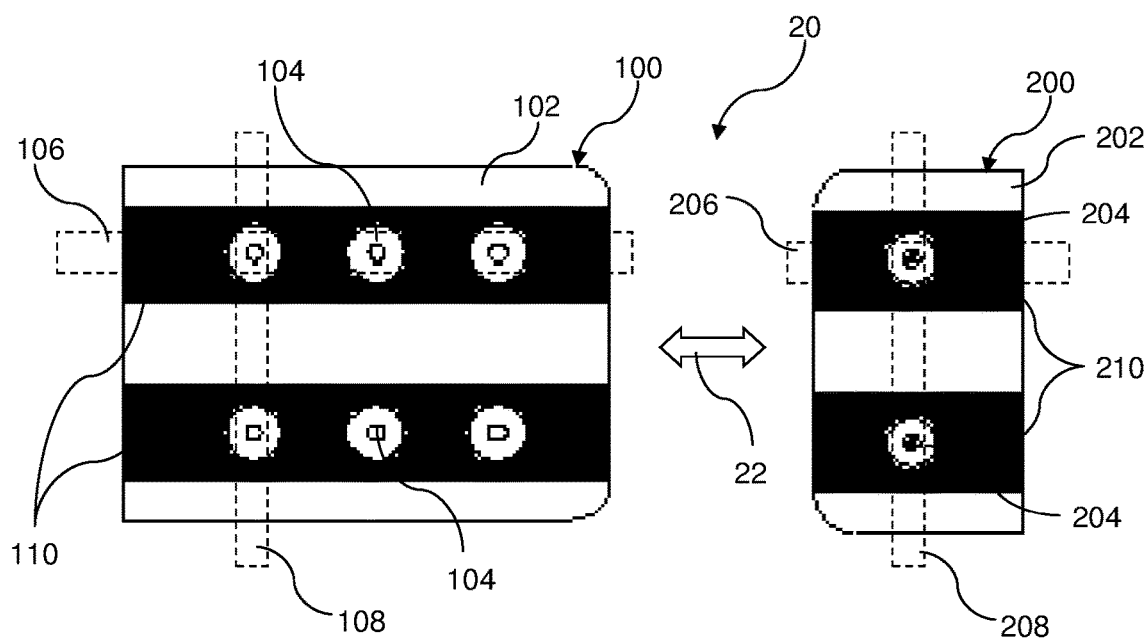

In other embodiments as shown in FIG. 1B, the first conductive paths 110 and second conductive paths 210, such as conductive ink, are respectively printed on the first substrate 102 and second substrate 202 first. The first conductive fasteners 104 and second conductive fasteners 204, which constitute mutually engageable snap-fit fasteners or snap buttons, are respectively attached to the first substrate 102 and second substrate 202, specifically on the first conductive paths 110 and second conductive paths 210, such as by riveting or stitching using conductive yarns or threads.

Figure 3A:
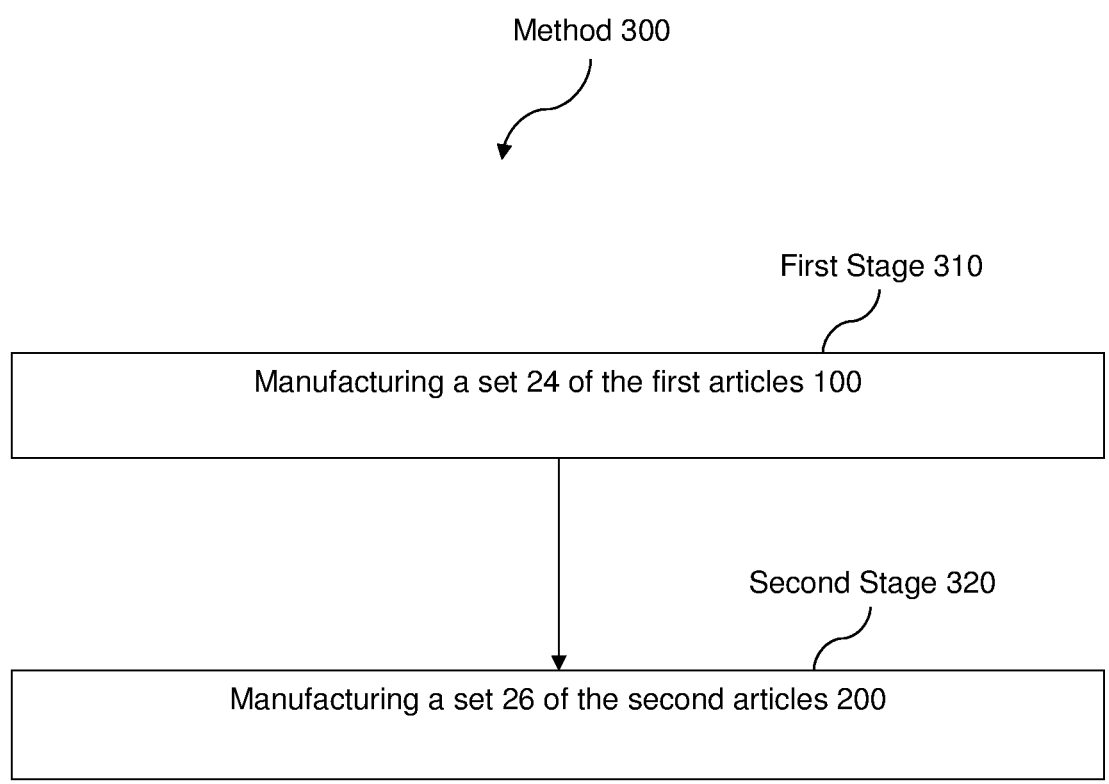
FIG. 3A to FIG. 3C are flowchart illustrations of a method of manufacturing the garment fastening products in accordance with embodiments of the present disclosure.

In various embodiments of the present disclosure, with reference to FIG. 3A, there is a method 300 of manufacturing the garment fastening products 20, each garment fastening product 20 including the first article 100 and the second article 200 coupleable 22 to each other for fastening the garment. The method 300 includes a first stage 310 of manufacturing a set 24 of the first articles 100, and a second stage 320 of manufacturing a set 26 of the second articles 200.

Figure 3B:
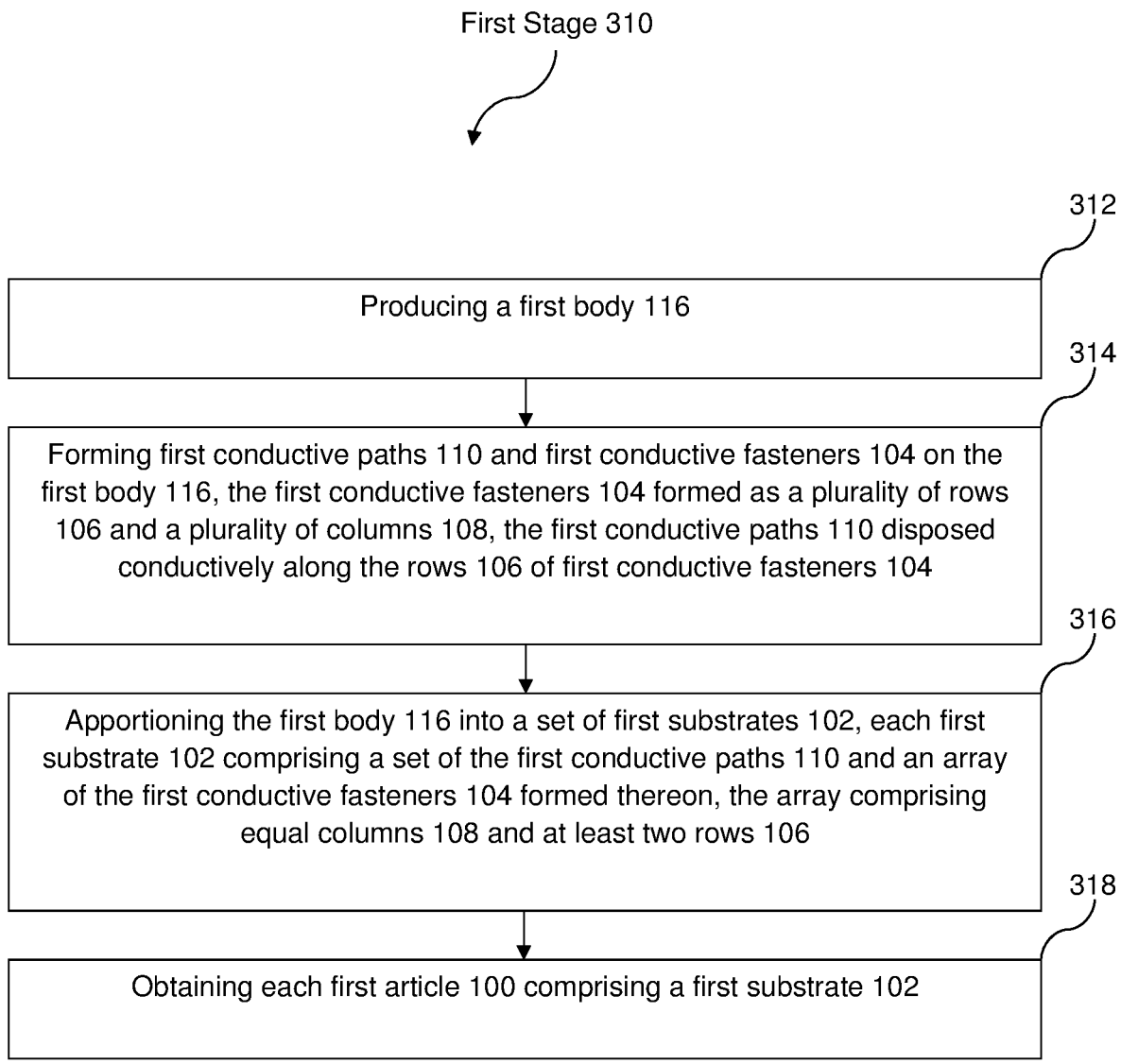

With reference to FIG. 3B, the first stage 310 of manufacturing the set 24 of first articles 100 includes a step 312 of producing a first body 116. The first stage 310 further includes a step 314 of forming the first conductive paths 110 and first conductive fasteners 104 on the first body 116. The first conductive fasteners 104 are formed/arranged as a plurality of rows 106 and a plurality of columns 108. The first conductive paths 110 are disposed conductively along the rows 106 of the first conductive fasteners 104. The first stage 310 further includes a step 316 of apportioning the first body 116 into a set of first body portions which are the first substrates 102. Each of the first substrates 102 includes a set of the first conductive paths 110 and an array of the first conductive fasteners 104 formed thereon. The array has equal columns 108 and at least two rows 106, meaning that among the set of first substrates 102, they have the same number of columns 108 and optionally different numbers of rows 106. The first stage 310 further includes a step 318 of obtaining each first article 100 including one of the first substrates 102.

Figure 3C:
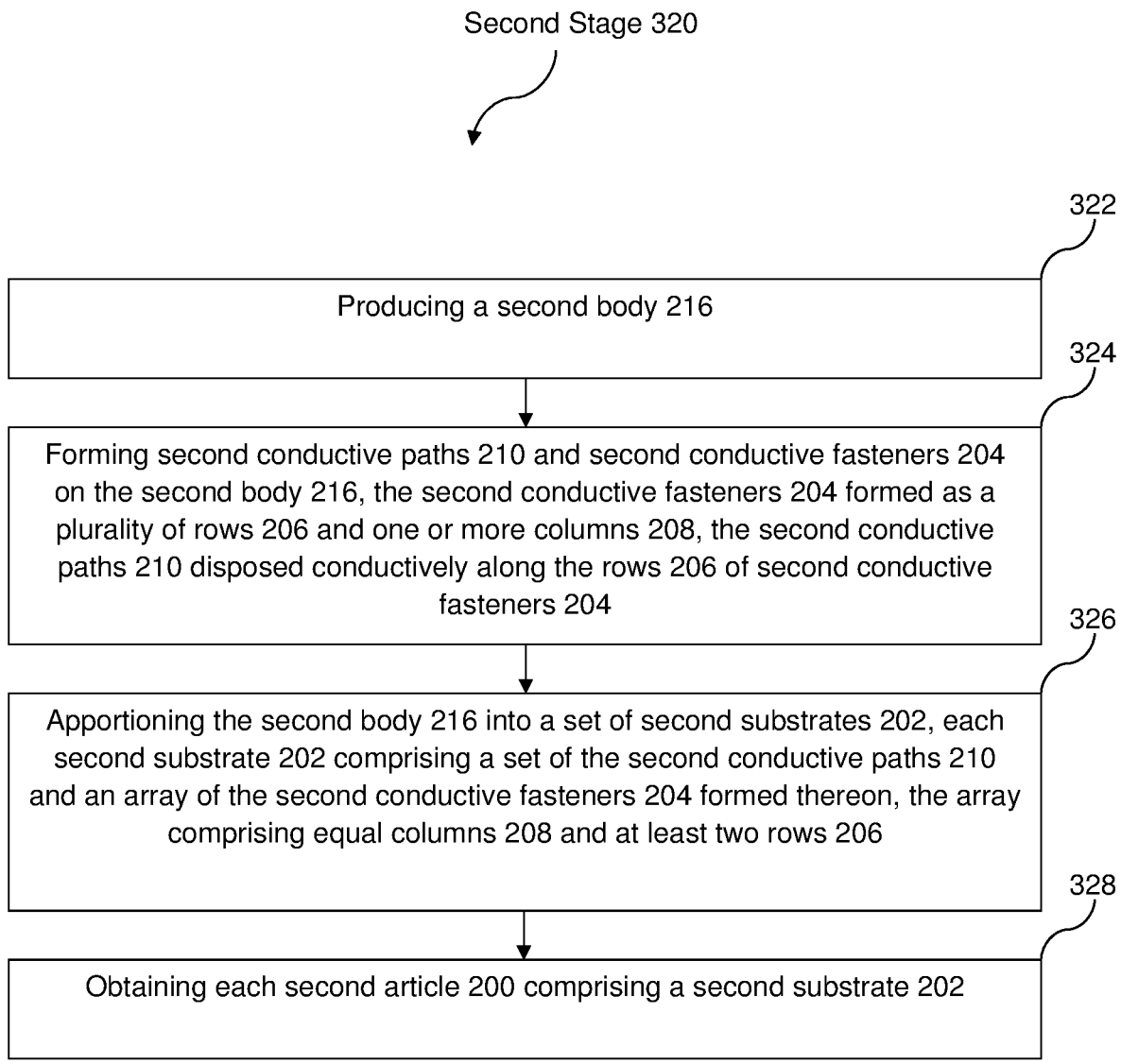

With reference to FIG. 3C, the second stage 320 of manufacturing the set 26 of second articles 200 includes a step 322 of producing a second body 216. The second stage 320 further includes a step 324 of forming the second conductive paths 210 and second conductive fasteners 204 on the second body 216. The second conductive fasteners 204 are formed/arranged as a plurality of rows 206 and one or more columns 208. The second conductive paths 210 are disposed conductively along the rows 206 of the second conductive fasteners 204. The second stage 320 further includes a step 326 of apportioning the second body 216 into a set of second body portions which are the second substrates 202. Each of the second substrates 202 includes a set of the second conductive paths 210 and an array of the second conductive fasteners 204 formed thereon. The array has equal columns 208 and at least two rows 206, meaning that among the set of second substrates 202, they have the same number of columns 208 and optionally different numbers of rows 206. The second stage 320 further includes a step 328 of obtaining each second article 200 including one of the second substrates 202.

For each garment fastening product 20 manufactured by the method 300, the first conductive fasteners 104 of the first article 100 are engageable with the second conductive fasteners 204 of the second article 200 for coupling 22 the first article 100 and second article 200 together and forming a conductive connection therethrough. Specifically, at least column 108 of the first conductive fasteners 104 is engageable with at least one column of the second conductive fasteners 204.

Figure 4A:
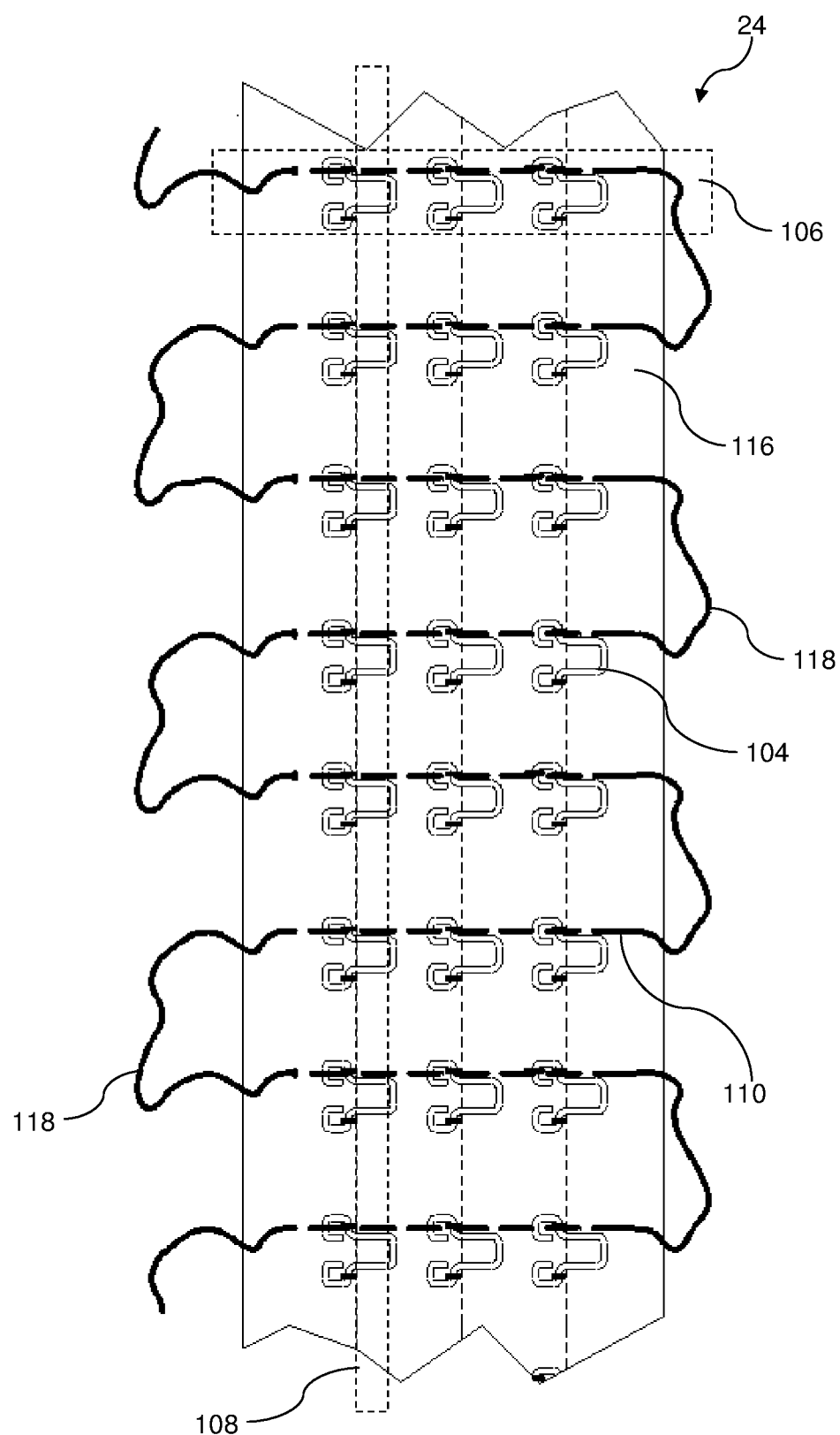
FIG. 4A and FIG. 4B are illustrations of the first and second articles of the garment fastening products in the manufacturing method, in accordance with embodiments of the present disclosure.
Figure 4B:
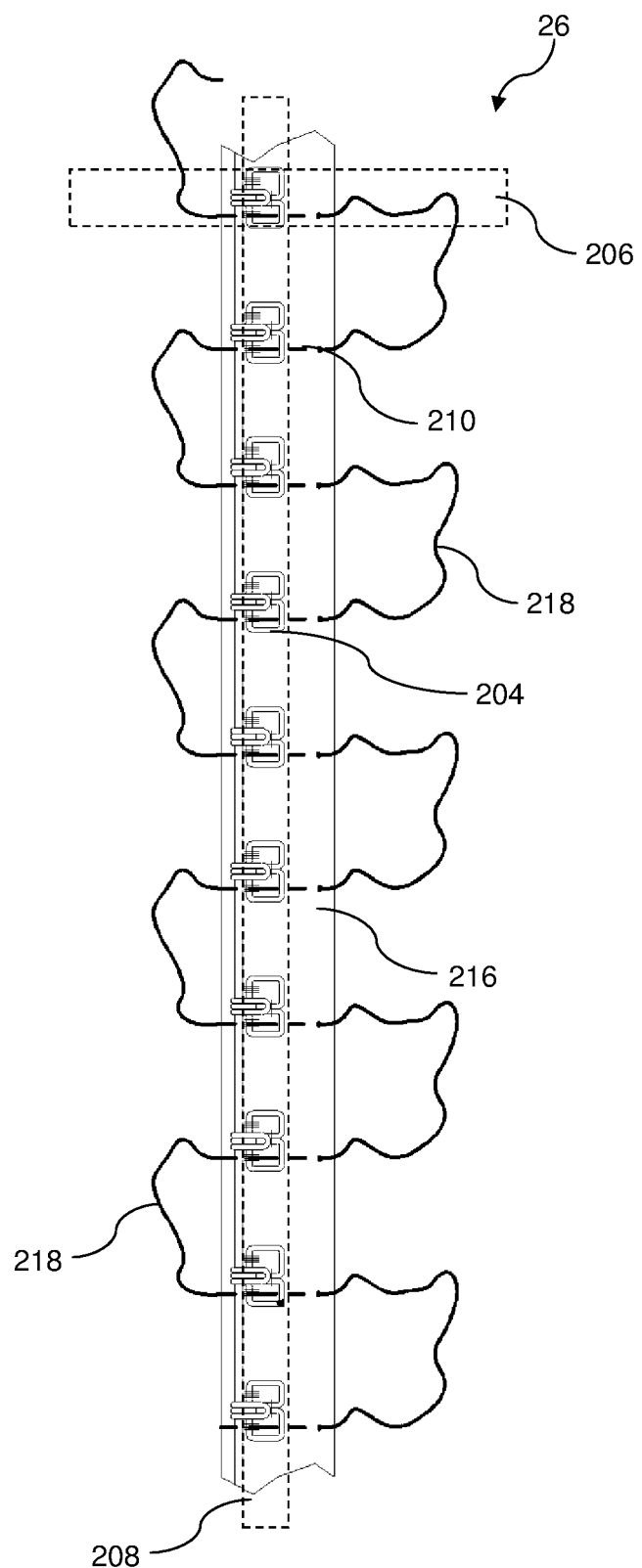

In the steps 312 and 322, with reference to FIG. 4A and FIG. 4B, the first body 116 and second body 216 are respectively produced by manufacturing as a continuous and elongated base substrate or tape. Each of first and second bodies 116 and 216 may include an elongated fabric body formed from one or more layers of fabric material. The fabric material may be selected and/or the layers of fabric material may be arranged based on various parameters such as thickness and structural strength/integrity of the material. Alternatively, the first and second bodies 116 and 216 may include films and/or membranes.

In the step 314, the first conductive paths 110 and first conductive fasteners 104 are formed on the first body 116, such that they are in electrical contact with each other. Similarly, in the step 324, the second conductive paths 210 and second conductive fasteners 204 are formed on the second body 216, such that they are in electrical contact with each other. In some embodiments, the first conductive fasteners 104 and second conductive fasteners 204 are respectively attached to the first body 116 and second body 216 first, such as by stitching using conductive yarns. Subsequently, the first conductive paths 110 and second conductive paths 210 are disposed conductively along the rows 106 of first conductive fasteners 104 and rows 206 of second conductive fasteners 204, respectively. For example, said connecting of the first conductive paths 110 includes stitching the first conductive paths 110 using conductive yarns on the first body 116 along the rows 106 of the first conductive fasteners 104. Similarly, said connecting of the second conductive paths 210 includes stitching the second conductive paths 210 using conductive yarns on the second conductive body 116 along the rows 206 of the second conductive fasteners 204. It will be appreciated that the first conductive fasteners 104 and second conductive fasteners 204 are sufficiently exposed on the first body 116 and second body 216, respectively, to facilitate said stitching of the conductive yarns along the first conductive fasteners 104 and second conductive fasteners 204.

The forming sequence may be reversed in some other embodiments. For example, in the step 314, the first conductive paths 110 are formed, such as by stitching, on the first body 116 as a plurality of rows first. The first conductive fasteners 104 are then attached to the first conductive paths 110 formed, such as by stitching or riveting on the first body 116, wherein the rows 106 of first conductive fasteners 104 correspond to the rows of first conductive paths 110. Similarly, in the step 324, the second conductive paths 210 are formed on the second body 216 as a plurality of rows first. The second conductive fasteners 204 are then attached to the second conductive paths 210 formed, wherein the rows 206 of second conductive fasteners 204 correspond to the rows of second conductive paths 210.

It will be appreciated that the various stitching operations described herein may be performed by a programmable pattern stitching machine or an embroidery machine for high precision.

In the steps 316 and 326, the first body 116 and second body 216 are apportioned into the first substrates 102 and second substrates 202, respectively. In the steps 318 and 328, the first articles 100 and second articles 200 are obtained from the first substrates 102 and second substrates 202, respectively. Said apportioning includes cutting the first body 116 and second body 216 according to desired dimensions and configurations for the first articles 110 and second articles 200, such as the number and arrangement of the conductive fasteners 104 and 204. The desired dimensions and configurations may be dependent on the end applications of the garment fastening product 20 and the garment. Each garment fastening product 20 includes a first article 100 and a second article 200. Optionally, for each garment fastening product 20, the rows 106 of first conductive fasteners 104 of the first article 100 and the rows 206 of second conductive fasteners 204 of the second article 200 are equal.

Figure 5A:
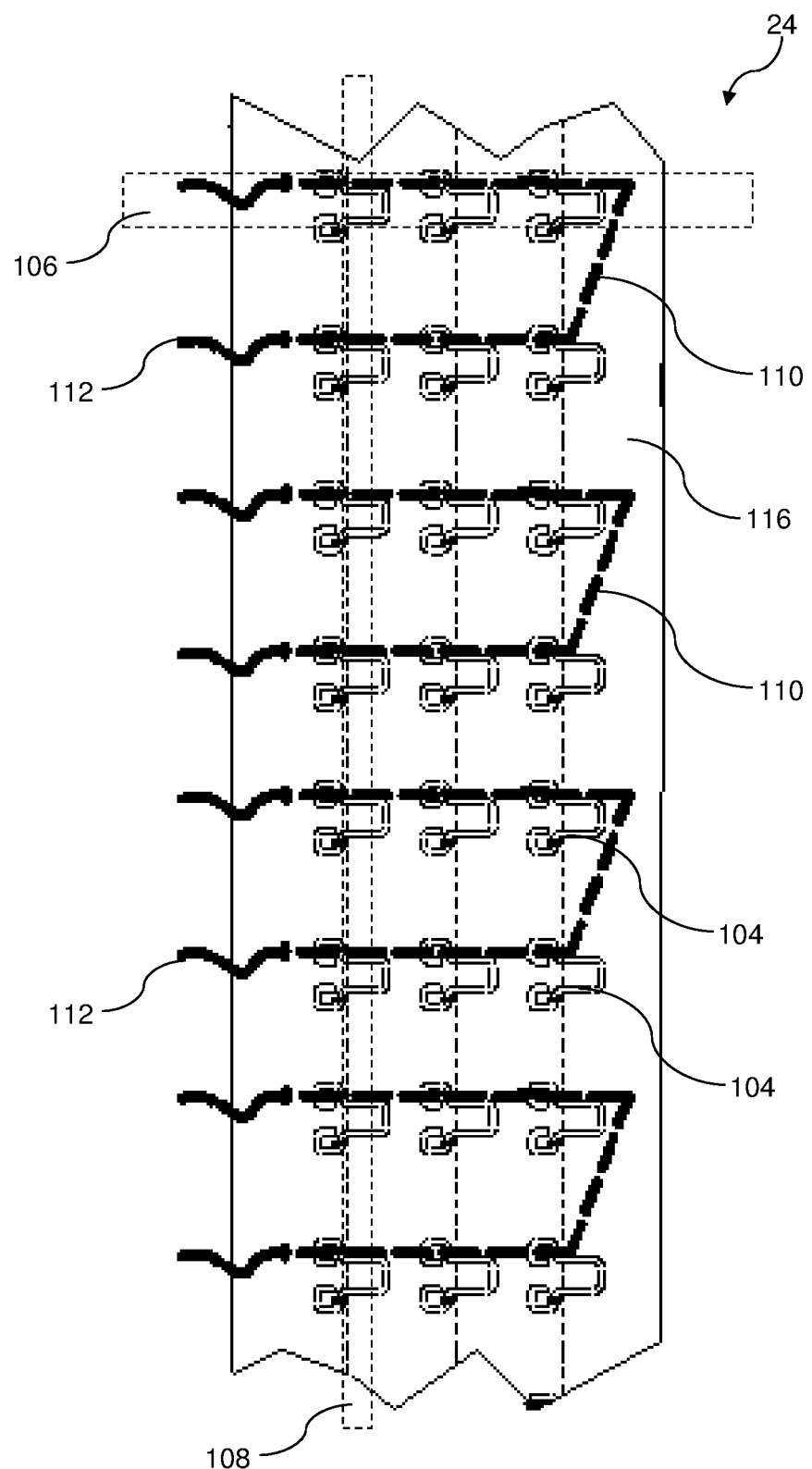
FIG. 5A and FIG. 5B are additional illustrations of the first and second articles in the manufacturing method, in accordance with embodiments of the present disclosure.
Figure 5B:
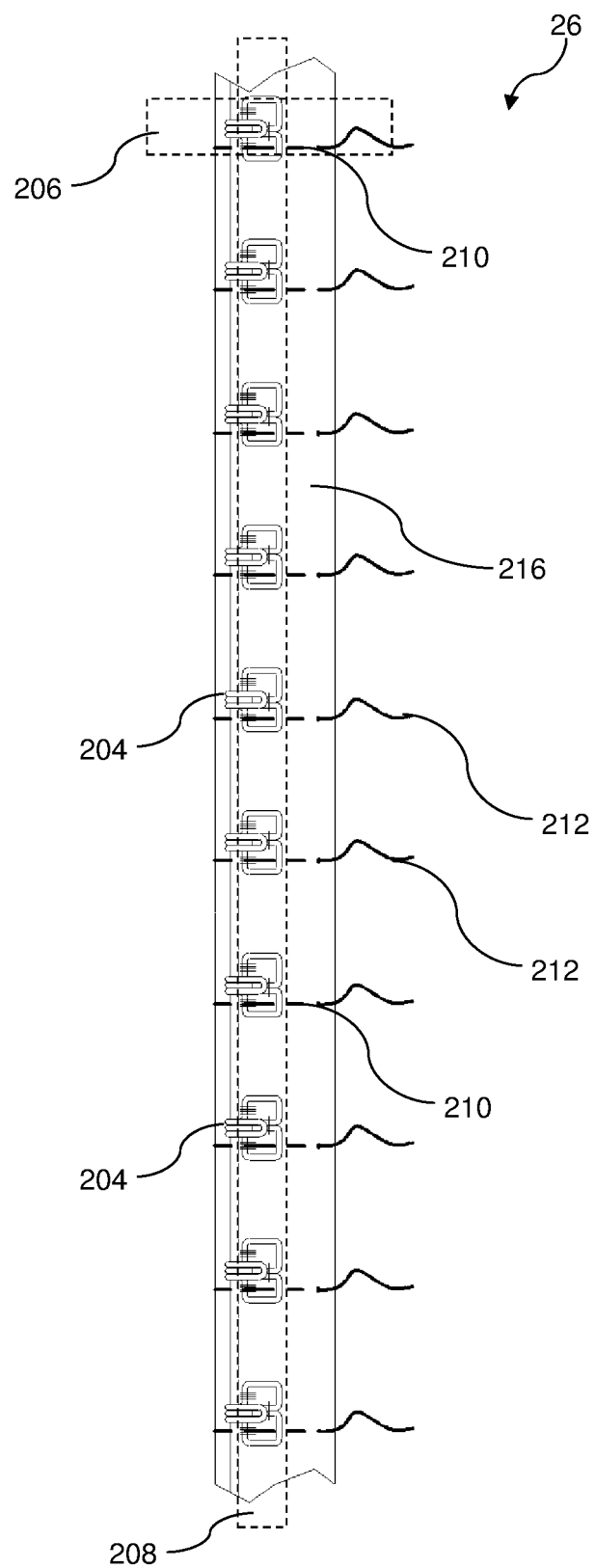

As shown in FIG. 4A and FIG. 4B, the stitching operations may leave some additional portions or overhangs 118 and 218 of the conductive yarns over the first body 116 and second body 216, respectively. Said apportioning includes trimming away the overhangs 118 and 218, as shown in FIG. 5A and FIG. 5B. Specifically, the first body 116 is apportioned such that for each first substrate 102, the ends 112 of the first conductive paths 110 extend approximately 5 mm beyond the first body 116. Similarly, the second body 216 is apportioned such that for each second substrate 202, the ends 212 of the second conductive paths 210 extend approximately 5 mm beyond the second body 216. It will be appreciated that the extension of the ends 112 and 212 beyond the first body 116 and second body 216, respectively, can vary as desired, such as depending on the applications of the fastening product 20. The ends 112 and 212 are for connecting to electronic components of the garment for performing various electronic functions and operations.

Figure 6A:
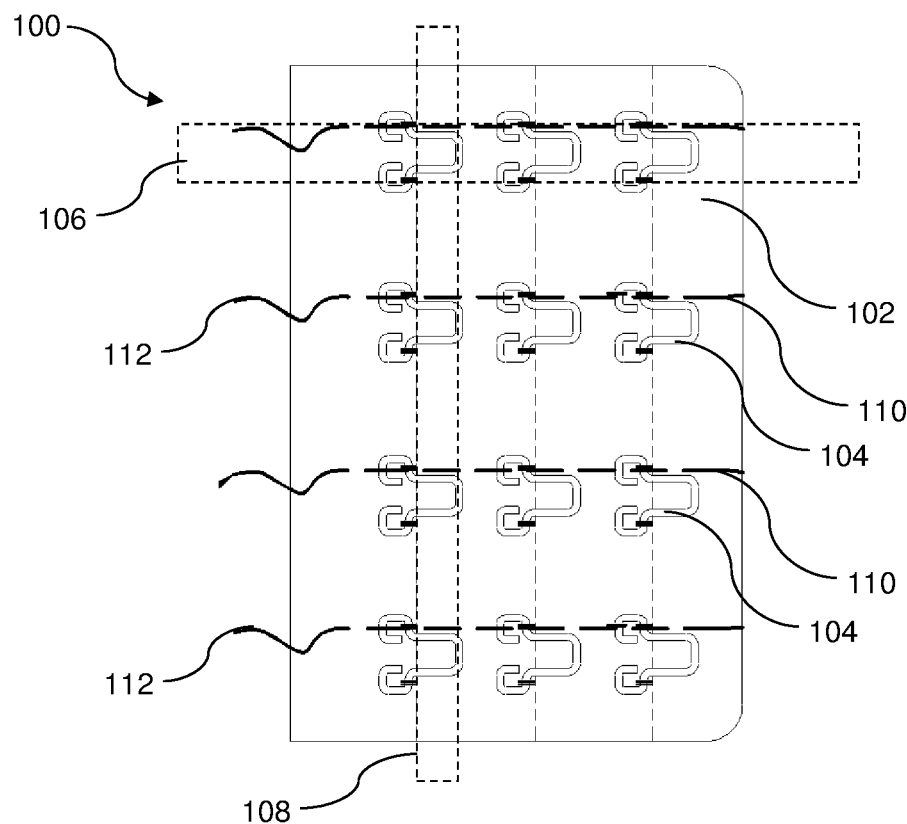
FIG. 6A and FIG. 6B are illustrations of the first articles in accordance with embodiments of the present disclosure.

FIG. 1A illustrates a first article 100 having the first conductive fasteners 104 arranged in two rows 106 and three columns 108, and a second article 200 having the second conductive fasteners 204 arranged in two rows 206 and one column 208. FIG. 6A illustrates a first article 100 having the first conductive fasteners 104 arranged in four rows 106 and three columns 108. The additional rows 106 provides for more secure fastening of the garment fastening product 20 and thus more secure fitting of the garment on the person.

Figure 6B:
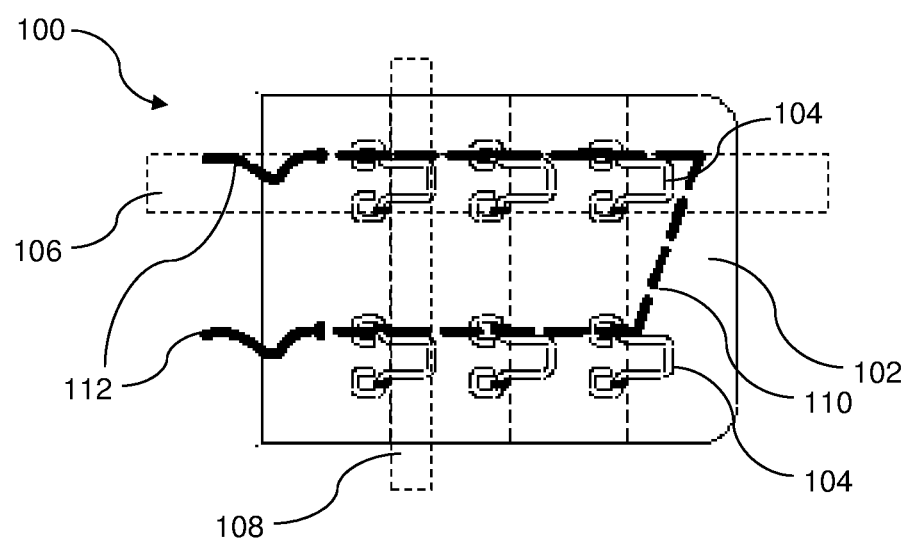

In some embodiments of the first article 100 as shown in FIG. 1A and FIG. 6A, the first body 116 is apportioned such that the first conductive paths 110 formed on a first substrate 102 are separately disposed along each distinct row 106 of first conductive fasteners 104. This allows each row 106 of first conductive fasteners 104 to function as a distinct connection to different electronic components of the garment, such as for performing different electronic operations by fastening to different rows 106. In some other embodiments of the first article 100 as shown in FIG. 6B, the first body 116 is apportioned such that the first conductive paths 110 formed on a first substrate 102 are continuously disposed along all the rows 106 of first conductive fasteners 104. The rows 106 thus function as a single continuous connection to the electronic components of the garment. It will be appreciated that said separate or continuous connecting of the first conductive paths 110 for the first article 100 applies similarly to the second conductive paths 210 for the second article 200.

Figure 7A:
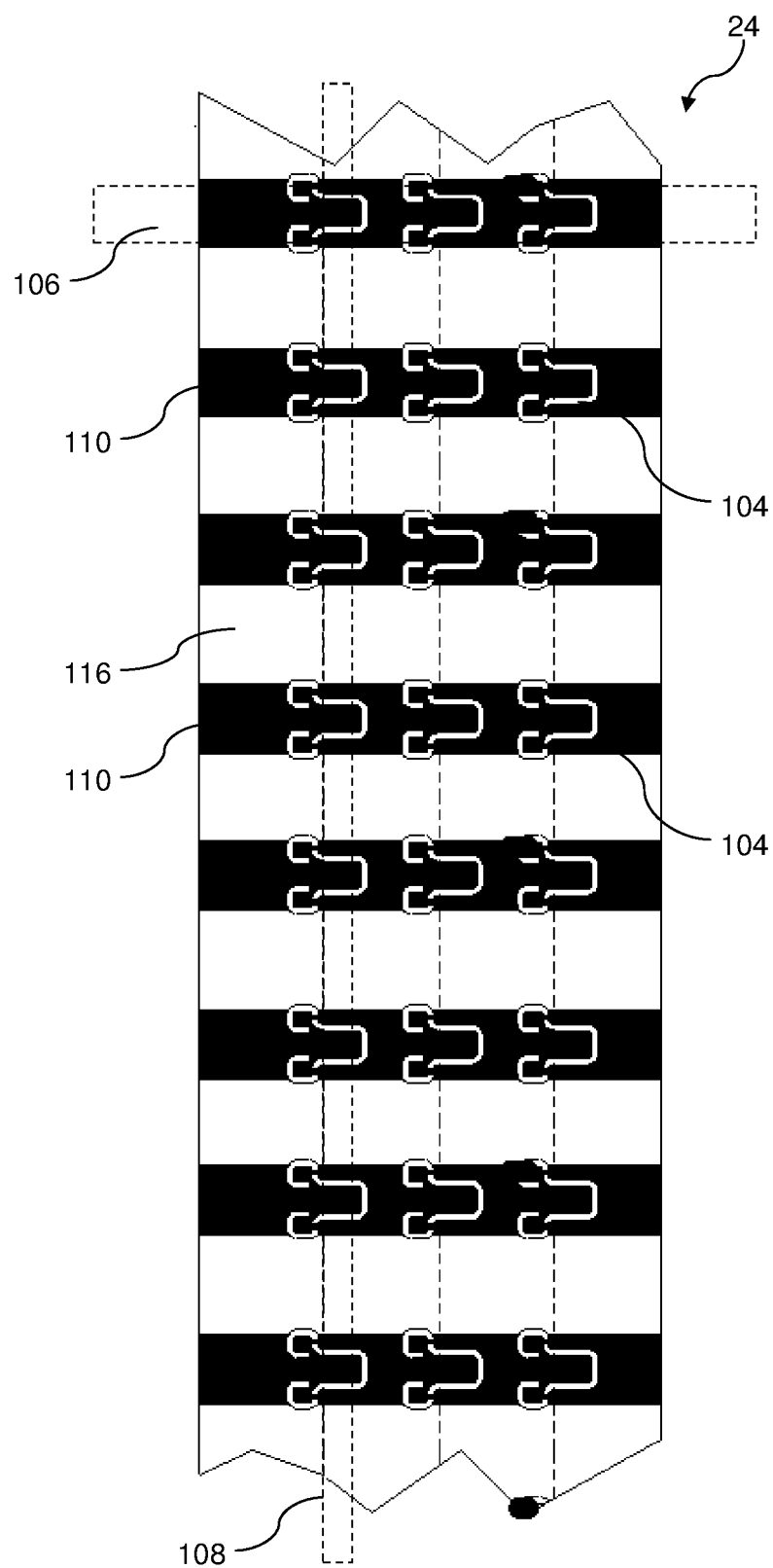
FIG. 7A and FIG. 7B are other illustrations of the first and second articles in the manufacturing method, in accordance with other embodiments of the present disclosure.

In some embodiments as shown in FIG. 7A, in the step 314, the first conductive paths 110 are formed, such as by printing using conductive ink, on the first body 116 as a plurality of rows first. Specifically, the first conductive paths 110 are printed on the outermost layer or surface of the first body 116. The design and properties of said printing and of the conductive ink may be dependent on the end applications of the garment fastening product 20 and the garment. The first conductive fasteners 104 are then attached to the first conductive paths 110 formed, such as by stitching or riveting on the first body 116, wherein the rows 106 of first conductive fasteners 104 correspond to the rows of first conductive paths 110. It will be appreciated that said printing of the first conductive paths 110 on the first body 116 applies similarly to printing of the second conductive paths 210 on the second body 216.

Figure 8A:
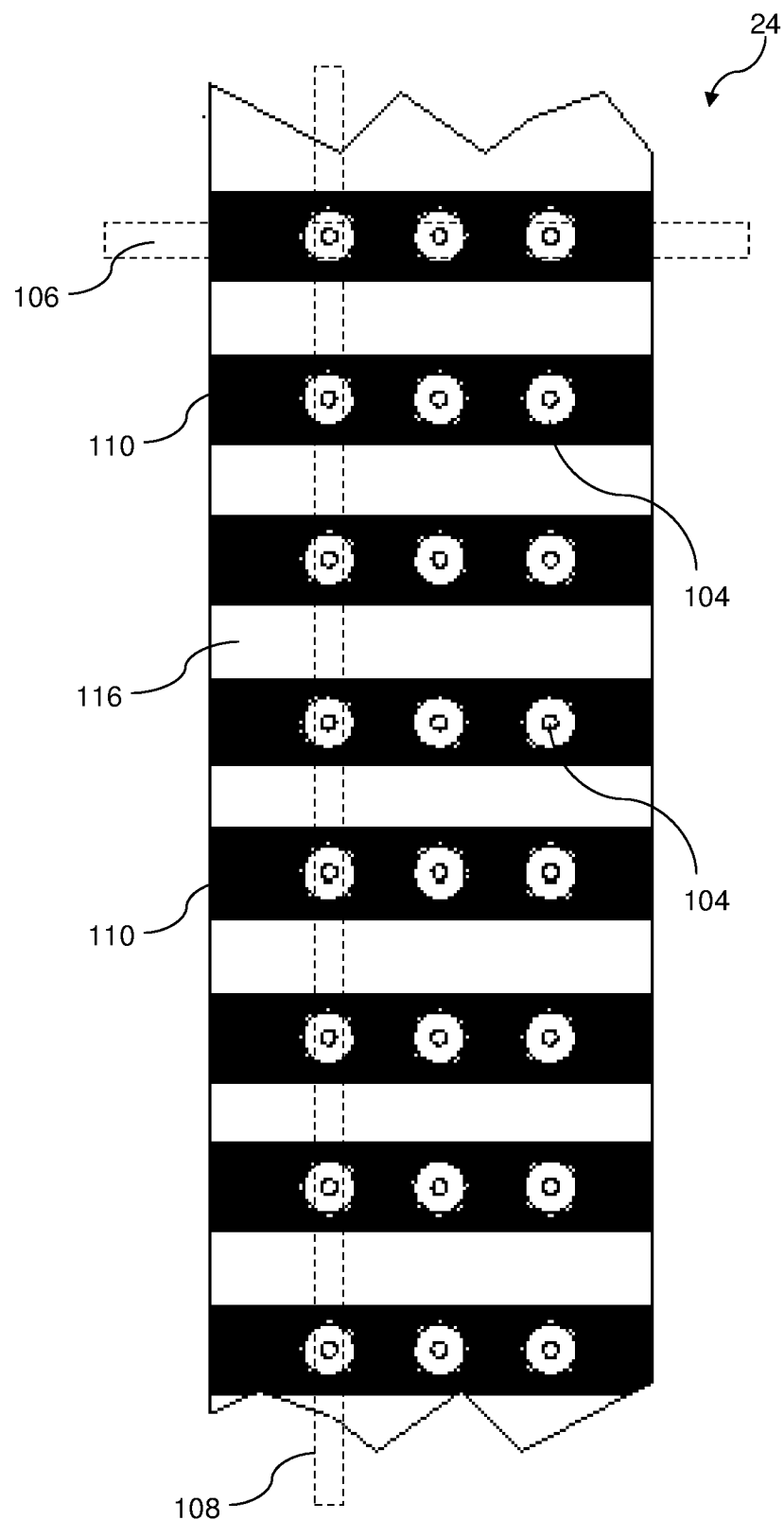
FIG. 8A and FIG. 8B are other illustrations of the first and second articles in the manufacturing method, in accordance with other embodiments of the present disclosure.
Figure 7B:
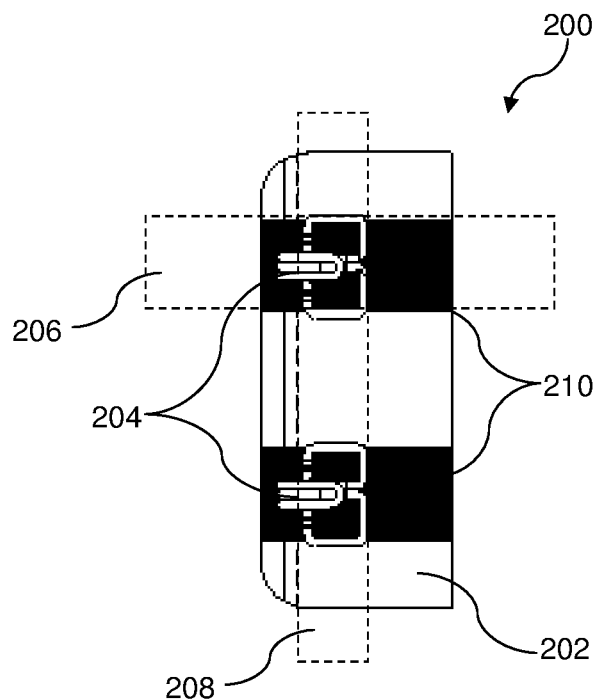
Figure 8B:
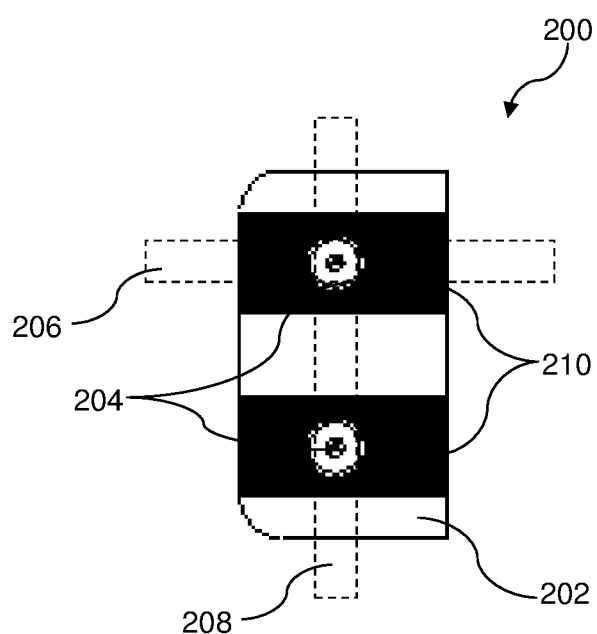

FIG. 7A and FIG. 7B illustrate the un-apportioned first body 116 and apportioned second article 200 with mutually engageable hooks and eyes as the first conductive fasteners 104 and second conductive fasteners 204. In some other embodiments, the first conductive fasteners 104 and second conductive fasteners 204 constitute mutually engageable snap-fit fasteners or snap buttons, as shown in FIG. 8A and FIG. 8B.

In the foregoing detailed description, embodiments of the present disclosure in relation to a garment fastening product 20 and a method 300 of manufacturing the garment fastening products 20 are described with reference to the provided figures. The description of the various embodiments herein is not intended to call out or be limited only to specific or particular representations of the present disclosure, but merely to illustrate non-limiting examples of the present disclosure. The present disclosure serves to address at least one of the mentioned problems and issues associated with the prior art. Although only some embodiments of the present disclosure are disclosed herein, it will be apparent to a person having ordinary skill in the art in view of this disclosure that a variety of changes and/or modifications can be made to the disclosed embodiments without departing from the scope of the present disclosure. Therefore, the scope of the disclosure as well as the scope of the following claims is not limited to embodiments described herein.

The invention claimed is:

1. A garment fastening product for a garment, comprising:
   a first article and a second article coupleable to each other for fastening the garment, the first article comprising:
      a first substrate;
      an array of first conductive fasteners attached to the first substrate, the array comprising a plurality of rows and a plurality of columns; and
      a set of first conductive paths disposed conductively along the rows of first conductive fasteners; and
   the second article comprising:
      a second substrate;
      an array of the second conductive fasteners attached to the second substrate, the array comprising a plurality of rows and one or more columns; and
      a set of second conductive paths disposed conductively along the rows of second conductive fasteners,
   wherein at least one column of the first conductive fasteners of the first article is engageable with at least one column of the second conductive fasteners of the second article for coupling the first and second articles together and forming a conductive connection therethrough.

2. The garment fastening product according to claim 1, wherein the first conductive paths are stitched on the first substrate along the rows of first conductive fasteners.

3. The garment fastening product according to claim 2, wherein the first conductive paths comprise conductive yarns.

4. The garment fastening product according to claim 1, wherein the first conductive paths are printed on the first substrate as a plurality of rows, and the rows of first conductive fasteners are correspondingly attached to the rows of first conductive paths.

5. The garment fastening product according to claim 4, wherein the first conductive paths comprise conductive ink.

6. The garment fastening product according to claim 1, wherein the first conductive paths are continuously disposed along all the rows of first conductive fasteners.

7. The garment fastening product according to claim 1, wherein the first conductive paths are separately disposed along each distinct row of first conductive fasteners.

8. The garment fastening product according to claim 1, wherein the first substrate comprises a fabric body.

9. The garment fastening product according to claim 1, wherein the first conductive paths are connectable to electronic components of the garment.

10. The garment fastening product according to claim 1, wherein the rows of first conductive fasteners and the rows of second conductive fasteners are equal.

11. The garment fastening product according to claim 1, wherein the first and second conductive fasteners comprise mutually engageable male and female fasteners.

12. The garment fastening product according to claim 1, wherein the garment is an undergarment.

13. A method of manufacturing garment fastening products, each garment fastening product comprising a first article and a second article coupleable to each other for fastening a garment, the method comprising:
   manufacturing a set of the first articles, comprising:
      producing a first body;
      forming first conductive paths and first conductive fasteners on the first body, the first conductive fasteners formed as a plurality of rows and a plurality of columns, the first conductive paths disposed conductively along the rows of first conductive fasteners;

apportioning the first body into a set of first substrates, each first substrate comprising a set of the first conductive paths and an array of the first conductive fasteners formed thereon, the array comprising equal columns and at least two rows; and obtaining each first article comprising a first substrate; and manufacturing a set of the second articles, comprising:

producing a second body;

forming second conductive paths and the second conductive fasteners on the second body, the second conductive fasteners formed as a plurality of rows and one or more columns, the second conductive paths disposed conductively along the rows of second conductive fasteners;

apportioning the second body into a set of second substrates, each second substrate comprising a set of the second conductive paths and an array of the second conductive fasteners formed thereon, the array comprising equal columns and at least two rows; and obtaining each second article comprising a second substrate, wherein for each garment fastening product, at least one column of the first conductive fasteners of the first article is engageable with at least one column of the second conductive fasteners of the second article for coupling the first and second articles together and forming a conductive connection therethrough.

14. The method according to claim 13, said forming of the first conductive paths and first conductive fasteners comprising:

attaching the first conductive fasteners to the first body; and disposing the first conductive paths conductively along the rows of first conductive fasteners.

15. The method according to claim 14, said disposing of the first conductive paths comprising stitching the first conductive paths on the first body along the rows of first conductive fasteners.

16. The method according to claim 13, said forming of the first conductive paths and first conductive fasteners comprising:

forming the first conductive paths on the first body as a plurality of rows; and attaching the first conductive fasteners to the first conductive paths formed, the rows of first conductive fasteners corresponding to the rows of first conductive paths.

17. The method according to claim 16, each of said forming of the rows of first conductive paths and said attaching of the first conductive fasteners comprising stitching on the first body.

18. The method according to claim 16, said forming of the rows of first conductive paths comprising printing on the first body.

* * * * *